(12) United States Patent
Roter et al.

(10) Patent No.: US 10,469,620 B2
(45) Date of Patent: Nov. 5, 2019

(54) METHOD FOR TRANSFERRING A NEW SOFTWARE VERSION TO AT LEAST ONE ELECTRICITY METER VIA A COMMUNICATION NETWORK

(71) Applicant: SAGEMCOM ENERGY & TELECOM SAS, Rueil Malmaison (FR)

(72) Inventors: Ziv Roter, Rueil Malmaison (FR); Jérémie Sergi, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 107 days.

(21) Appl. No.: 15/375,594

(22) Filed: Dec. 12, 2016

(65) Prior Publication Data
US 2017/0171355 A1    Jun. 15, 2017

(30) Foreign Application Priority Data
Dec. 11, 2015    (FR) ..................................... 15 62197

(51) Int. Cl.
*H04L 29/08*    (2006.01)
*G01R 21/133*    (2006.01)
(Continued)

(52) U.S. Cl.
CPC ............ *H04L 67/34* (2013.01); *G01R 21/133* (2013.01); *G06F 8/65* (2013.01); *G06F 8/656* (2018.02);
(Continued)

(58) Field of Classification Search
CPC .............. H04B 2203/5433; H04B 3/54; H04B 2203/5441; G06F 11/1433
See application file for complete search history.

(56) References Cited

U.S. PATENT DOCUMENTS

| 9,024,780 | B2 | 5/2015 | Osterloh et al. | |
| 2006/0164257 | A1* | 7/2006 | Giubbini | H04B 3/546 340/870.02 |

(Continued)

OTHER PUBLICATIONS

Search Report for FR 1562197, dated Sep. 22, 2016, 2 pages.
(Continued)

*Primary Examiner* — Barbara B Anyan
(74) *Attorney, Agent, or Firm* — Nixon & Vanderhye P.C.

(57) ABSTRACT

A new version of a software is broken down into successive blocks in order to be transferred block by block in two phases by a concentrator device: a first phase during which said concentrator device performs (S308) the transfer according to a sequencing independent of whether or not each block has been correctly received, and a second phase during which the concentrator device performs (S310) the transfer of each block that has not been correctly received. The new version of the software is thus transferred to electricity meters via a communication network. Each electricity meter stores in non-volatile memory a context including an indication of each block of the new version of the software that has not been correctly received and, when the transfer of the new version of the software to at least one electricity meter is interrupted, the subsequent resumption of the transfer of the new version of the software to said electricity meter or meters takes place according to the second phase by means of their respective contexts.

11 Claims, 2 Drawing Sheets

(51) Int. Cl.
  *G06F 8/65* (2018.01)
  *H04B 3/54* (2006.01)
  *G06F 11/14* (2006.01)
  *G06F 9/445* (2018.01)
  *G06F 8/656* (2018.01)
  *H04L 29/06* (2006.01)

(52) U.S. Cl.
  CPC ...... *G06F 9/44536* (2013.01); *G06F 11/1433* (2013.01); *H04B 3/54* (2013.01); *H04B 2203/5433* (2013.01); *H04L 67/42* (2013.01)

(56) References Cited

U.S. PATENT DOCUMENTS

| | | | | |
|---|---|---|---|---|
| 2012/0126790 A1* | 5/2012 | Sobotka | ................ | G01D 4/002 |
| | | | | 324/119 |
| 2012/0207056 A1* | 8/2012 | Ree | ................ | H04W 8/245 |
| | | | | 370/254 |
| 2015/0121359 A1* | 4/2015 | Osterloh | ................ | G06F 8/654 |
| | | | | 717/172 |

OTHER PUBLICATIONS

"P3 Companion Standard Dutch Smart Meter Requirements", XP055304605, Apr. 18, 2008, pp. 1-73.
G. Struklec et al., "Implementing DLMS/COSEM in Smart Meters", Energy Market (EEM), 2011 8$^{th}$ International Conference on The European, IEEE, May 25, 2011, pp. 747-752.
A. Kheaksong et al., "Packet Transfer of DLMS/COSEM Standards for Smart Grid", The 20$^{th}$ Asia-Pacific Conference on Communication, IEEE, Oct. 1, 2014, pp. 391-396.

\* cited by examiner

METHOD FOR TRANSFERRING A NEW SOFTWARE VERSION TO AT LEAST ONE ELECTRICITY METER VIA A COMMUNICATION NETWORK

CROSS-REFERENCE TO RELATED APPLICATION

This application claims priority to FR Patent Application No. 15/62197 filed 11 Dec. 2015, the entire content of which is hereby incorporated by reference.

BACKGROUND OF THE INVENTION

The present invention relates to the transfer of a new version of a software from a concentrator device to at least one electricity meter in a powerline communication subnetwork.

In the context of electrical supply networks of AMM (Automated Meter Management) type, communications are established between electricity meters (known as smart meters) and a data concentrator device, sometimes referred to as base node or coordinator. This is the case for example in the PRIME ("PoweRline Intelligent Metering Evolution") or G3-PLC specifications. Exchanges between the electricity meters and the data concentrator device rely on powerline communications. The concentrator device is then the root of the communication network, which has a logical topology in tree form to allow extending the communications range. Node devices then serve as relays on behalf of other node devices in the communication network when the latter do not manage to receive information directly from the root node device.

The 12$^{th}$ edition of "Bluebook: COSEM Interface Classes and OBIS Object Identification System" published by the DLMS User Association describes a two-phase method for deploying a new software version, broken down into blocks, to electricity meters from the concentrator device: a first phase during which the transfer is made without retransmission, meaning without its being necessary to know whether a block is correctly received before passing to the transfer of the following block, and a second phase subsequent to the first phase during which the transfer of each block that has not been correctly received during the first phase is carried out. When the transfer is interrupted for at least one electricity meter, for example by disconnection of said electricity meter or meters, the transfer subsequently resumes by reimplementation of the first phase. This approach does however lack efficiency.

It is then desirable to overcome these drawbacks of the prior art and in particular to allow increasing the efficiency of the transfer of a new software version intended for electricity meters in a context of electricity supply networks of AMM type in which disconnections of said electricity meters may occur.

SUMMARY OF THE INVENTION

The invention relates to a method for transferring a new version of a software to at least one electricity meter in a communication network comprising a server and at least one powerline communication subnetwork, each electricity meter connecting to the communication network via one said powerline communication subnetwork, each powerline communication subnetwork comprising a concentrator device connected to the server, each concentrator device obtaining the new version of the software from the server and being responsible for transferring the new version of the software in the powerline communication subnetwork to which said concentrator device belongs. The new version of the software being broken down into successive blocks, the transfer of the new version of the software is performed by each concentrator device block by block in two phases: a first phase during which said concentrator device performs the transfer according to a sequencing independent of whether or not each block has been correctly received, and a second phase, subsequent to the first phase, during which the concentrator device performs the transfer of each block that was not correctly received by at least one electricity meter during the first phase. The method is such that each electricity meter stores in non-volatile memory a context including an indication of each block of the new version of the software that has not been correctly received and, when the transfer of the new version of the software to at least one electricity meter is interrupted, the subsequent resumption of the transfer of the new version of the software to said electricity meter or meters takes place according to the second phase by means of their respective contexts. Thus, by resuming the transfer according to the second phase when a disconnection-reconnection of the electricity meter occurs, the efficiency of the transfer of the new version of the software is improved since, by virtue of the context saved by each electricity meter, only the blocks that were not previously correctly received are then transferred. Each electricity meter saving its own context, management of the possible lapsing of each context is facilitated at the time of any disconnection of said electricity meter (since the communication network does not a priori know whether the electricity meter will actually be reconnected).

According to a particular embodiment, the transfer to at least one electricity meter is interrupted by disconnection of said electricity meter or meters, and the transfer of the new version of the software to said electricity meter or meters resumes according to the second phase when said electricity meter or meters are reconnected, whatever the communication subnetwork to which said electricity meter or meters reconnect. Thus, each electricity meter saving its own context, management of access to the context is facilitated in the case where said electricity meter is disconnected from a communication subnetwork and reconnected to another communication subnetwork.

According to a particular embodiment, at the beginning of the transfer, a flag in the context indicates, associated with each block identified by its sequence number, that said block is considered to be not correctly received, and each meter correctly receiving a block indicates so by modification of the flag associated with said block.

According to a particular embodiment, the context stores: information identifying the version of the software that was received by the concerned electricity meter and the size of said version of the software, when all the blocks of said version of the software have been correctly received by said electricity meter; information identifying the version of the software that is currently being transferred and the size of said version of the software, when the transfer is not yet complete. In addition, when the transfer of the new version of the software to at least one electricity meter is interrupted, resumption of the transfer of the new version of the software to said electricity meter takes place according to the second phase if said information stored in said context corresponds to said new version of the software, and otherwise a transfer of another more recent software version is initiated according to the first phase.

According to a particular embodiment, for each block correctly received by an electricity meter, said electricity meter modifies its context in order to indicate that said block has been correctly received and, during said first phase, the transfer of the new version of the software to each concerned electricity meter is at the initiative of the concentrator device to which said electricity meter is attached. In addition, during the second phase, each concentrator device requests each concerned electricity meter in the communication subnetwork to which said concentrator device belongs to supply thereto with the context of said electricity meter, and, at its initiative, transmits to each concerned electricity meter each block that has not been correctly received according to the context of said electricity meter, and this repeatedly until one of the following conditions is fulfilled: all the blocks are correctly received by said electricity meter; and said electricity meter is disconnected.

The invention also relates to a communication network comprising at least one electricity meter, a server and at least one powerline communication subnetwork, each electricity meter connecting to the communication network via one said powerline communication subnetwork, each powerline communication subnetwork comprising a concentrator device connected to the server, each concentrator device obtaining from the server a new version of the software to be transferred to at least one said electricity meter and being responsible for transferring the new version of the software in the powerline communication subnetwork to which said concentrator device belongs. In addition, the new version of the software being broken down into successive blocks, the transfer of the new version of the software is performed by each concentrator device block by block in two phases: a first phase during which said concentrator device performs the transfer according to a sequencing independent of whether or not each block has been correctly received, and a second phase, subsequent to the first phase, during which the concentrator device performs the transfer of each block that was not correctly received by at least one electricity meter during the first phase. The communication network is such that each electricity meter comprises a non-volatile memory in which said electricity meter stores a context including an indication of each block of the new version of the software that has not been correctly received and, when the transfer of the new version of the software to at least one electricity meter is interrupted, the subsequent resumption of the transfer of the new version of the software to said electricity meter or meters takes place according to the second phase by means of their respective contexts.

BRIEF DESCRIPTION OF THE DRAWINGS

The features of the invention mentioned above, as well as others, will emerge more clearly from a reading of the following description of an example embodiment, said description being given in relation to the accompanying drawings, among which.

DETAILED DESCRIPTION OF AT LEAST ONE EMBODIMENT OF THE INVENTION

The invention relates to the transfer of a new software version block by block in two phases: a first phase during which the transfer is made without retransmission, meaning without its being necessary to know whether a block is correctly received before passing to the transfer of the following block, and a second phase subsequent to the first phase during which the transfer of each block that has not been correctly received in the first phase is performed. When the transfer of the new version of the software to at least one electricity meter is interrupted, the subsequent resumption of the transfer of the new version of the software to said electricity meter or meters takes place according to the second phase, meaning without taking account of the fact that the interruption took place during the first phase, during the second phase, or between the first phase and the second phase. The transfer thus resumes through the transfer of the blocks that were not correctly received (a block not received being a block not correctly received). As detailed below, the invention fits more particularly in a context of the updating, via a powerline communication subnetwork, of a software intended to be executed by electricity meters, referred to as smart meters.

Figure 1:
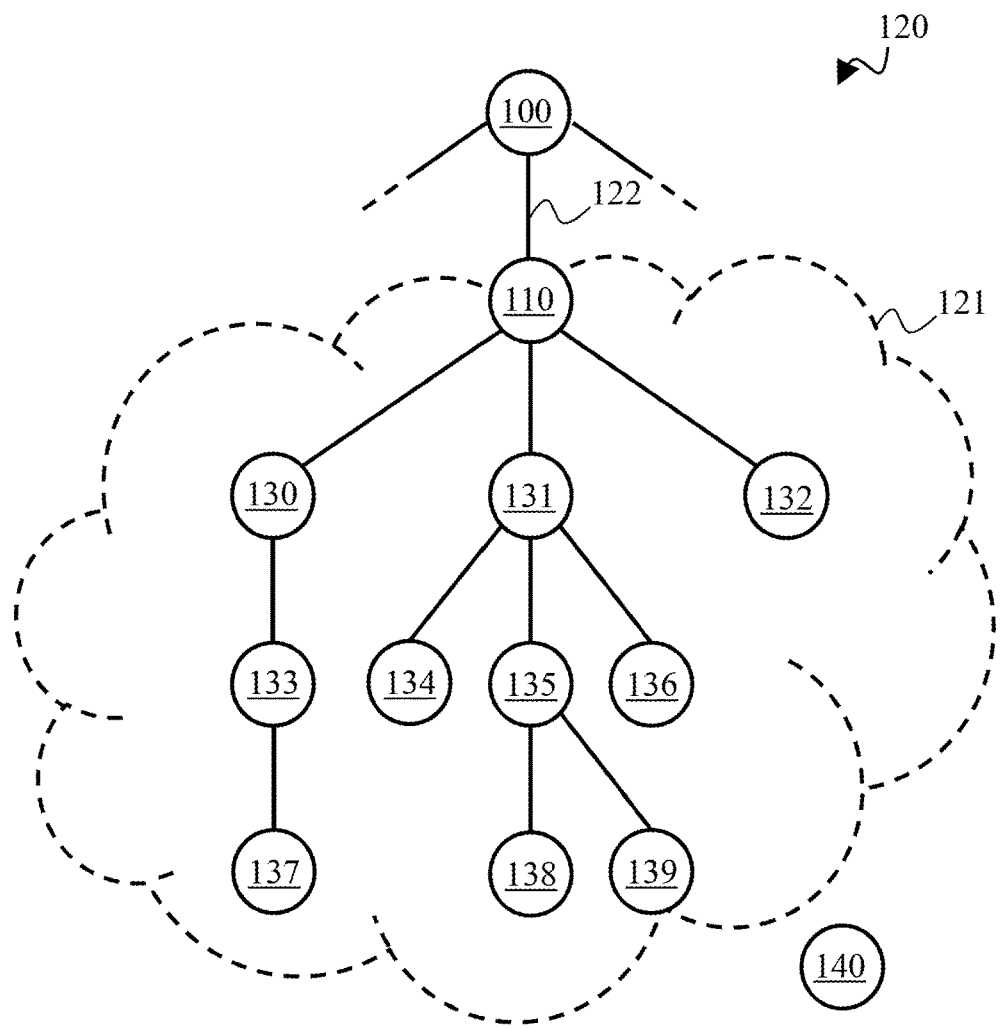
FIG. 1 schematically illustrates a communication network, the logical topology of which is in tree form, deployed on an electrical supply network in which the invention can be implemented.

FIG. 1 schematically illustrates a communication network 120 comprising at least one communication subnetwork 121 having a logical topology in the form of a tree deployed on an electrical supply network in which the invention can be implemented.

The communication subnetwork 121 is in the form of a tree, a particular node device 110 of which, referred to as a concentrator device or base node or coordinator, is the root. The communication subnetwork 121 is intended to enable connecting a plurality of node devices to the concentrator device 110. In the context of FIG. 1, the node devices that the communication subnetwork 121 aims to connect are electricity meters, referred to as smart meters. The communication subnetwork 121 thus enables establishing powerline communications, so that the concentrator device 110 can in particular automatically perform operations of collecting electricity consumption metering readings, said metering being done by the electricity meters vis-à-vis electrical installations that said electrical meters are respectively responsible for supervising, and so that the concentrator device 110 can perform software update operations with electricity meters in the communication subnetwork 121, as described hereafter in relation to FIG. 3.

The communication subnetwork 121 is preferentially of PRIME or G3-PLC type.

The communication network 120 further comprises a server 100 to which the concentrator device 110 is connected via a communication link 122. The communication link 122 is for example of GPRS ("General Packet Radio Service"), UMTS ("Universal Mobile Telecommunication System") or LTE ("Long-Term Evolution") type or the Internet. The concentrator device 110 performs, in the communication subnetwork 121, said operations of collecting metering readings and of software update on behalf of the server 100. In other words, the concentrator device 110 collects the metering readings from the electricity meters that are attached thereto (i.e. the electricity meters in the communication subnetwork 121) and manages any retransmission requirements in the communication subnetwork 121, and then supplies said readings to the server 100 for processing; in addition the concentrator device 110 ensures the software update of the electricity meters that are attached thereto, block by block, as described hereafter in relation to FIG. 3.

When the communication network 120 comprises a plurality of communication subnetworks having respective logical topologies in tree form deployed on an electrical supply network (as the communication subnetwork 121), the concentrator device of each communication subnetwork is thus connected to the server 100 via such a communication link 122. The operations of collecting metering readings and of software update are then performed by each concentrator device, in their respective communication subnetwork, on behalf of the server 100.

Exchanges to the DLMS/COSEM ("Device Language Message Specification/Companion Specification for Energy Metering") format, as described in the standard document IEC 62056-5-3 and in the $12^{th}$ edition of the "Bluebook: COSEM Interface Classes and OBIS Object Identification System" published by the DLMS User Association, are thus preferentially used for performing the operations of metering reading and of software update, the software update operations however being in accordance with the behaviour described hereafter in relation to FIG. 3.

It is necessary to understand that, in the communication subnetwork 121, a signal sent by a node device is in general not visible at every point in said communication subnetwork. Each node device sending signals then has a "vicinity field", meaning a subset of said communication subnetwork 121 in which any connected node device can intelligibly receive said signals. The vicinity field corresponds to the range of the signals emitted, according to predetermined transmission parameters (e.g. power, modulation and coding scheme, etc.) of the node device sending the signal and also according to characteristics of the communication channel (attenuation, noise, impedance, etc.). Each node device in said communication subnetwork thus has its own vicinity field. To allow extending the range of the powerline communications, node devices fulfil the role of data relays between other node devices and the concentrator device 110. Such a relay device is called a switch in the PRIME specifications, or router in the G3-PLC specifications. Some communications between node devices and the concentrator device 110 may require a plurality of successive data relays. A node device not fulfilling the role of relay is referred to as a terminal device. Such a structure therefore defines attachments of node devices to one another in order to form the logical topology in tree form, meaning the hierarchy constituting the communication subnetwork 121. Each node device in the communication subnetwork 121 is thus associated with a hierarchical level, corresponding typically to the quantity of relay devices via which said node device has to pass in order to reach the root of the communication subnetwork 121, namely the concentrator device 110. Apart from relaying data, the relay devices send beacons, which enable the node devices that are attached thereto to synchronise with the communication subnetwork 121.

Such a communication subnetwork in tree form is shown in FIG. 1. A terminal node device 132 is directly attached to the concentrator device 110. Two other node devices 130 and 131 are also directly attached to the concentrator device 110. These two node devices 130 and 131 fulfil the role of relay devices between the concentrator device 110 and other node devices. The node device 130 fulfils the role of relay device between the concentrator device 110 and a node device 133 which, itself, fulfils the role of relay device between the node device 130 and a terminal device 137. The communications between the concentrator device 110 and the terminal device 137 therefore pass through two successive relay devices, namely the relay devices 130 and 133. The node device 131 fulfils the role of relay device between the concentrator device 110 and three other node devices 134, 135 and 136. The node devices 134 and 136 are terminal devices, and the node device 135 fulfils the role of relay device between the node device 131 and two terminal devices 138 and 139. Thus the node devices 130, 131 and 132 are associated with a hierarchical level of value "0", the node devices 133, 134, 135, 136 are associated with a hierarchical level of value "1", and so on.

A node device that is not attached to the communication network 121 is a disconnected device, such as the node device 140 in FIG. 1.

It is necessary to understand that the logical topology of the communication subnetwork 121 is not fixed. FIG. 1 shows the logical topology of the communication subnetwork 121 at a given instant. Because in particular of the phenomena of interferences (such as noise, attenuation, impedance variation, crosstalk, signal collision, etc.), node devices may be disconnected from the communication subnetwork 121 and then seek to re-register in the communication network 120. The logical topology of the communication subnetwork 121 at this moment is then probably different from the logical topology of the communication subnetwork 121 before disconnection of said node devices, some node devices having then been potentially deprived of their roles of relays and others having then been potentially promoted to fulfil the role of relay. When re-registering in the communication network 120, the communication nodes that were disconnected from the communication subnetwork 121 are going to seek to reconnect to the communication subnetwork 121 or to another communication subnetwork of the communication network 120.

Figure 2:
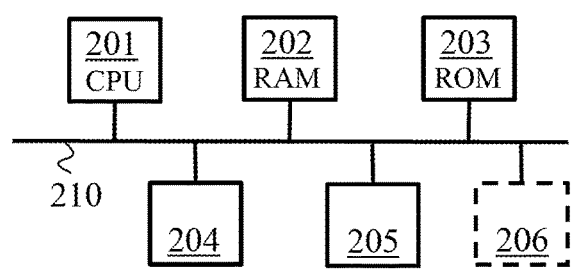
FIG. 2 schematically illustrates an example of hardware architecture of a communication device in the communication network of FIG. 1.

FIG. 2 schematically illustrates an example of hardware architecture of a communication device of the communication network 120, whether it be the server 100 or, in the communication subnetwork 121, the concentrator device 110, a relay device or a terminal device.

Let us consider that FIG. 2 schematically depicts the architecture of an electricity meter in the communication subnetwork 121. The electricity meter then comprises, connected by a communication bus 210: a processor or CPU (Central Processing Unit) 201; a Random Access Memory (RAM) 202; a Read Only Memory (ROM) 203; a storage unit or a storage medium reader, such as an SD (Secure Digital) card reader 204 or a Hard Disc Drive (HDD); and at least one communication interface 205.

When the architecture of FIG. 2 represents an electricity meter, said electricity meter comprises a communication interface 205 enabling the electricity meter to perform powerline communications. When the architecture in FIG. 2 represents the server 100, said server 100 comprises a communication interface 205 enabling the server 100 to perform communications via the communication link (such as the communication link 122) with each concentrator device (such as the concentrator device 110) in the communication network 120. When the architecture in FIG. 2 represents a concentrator device (such as the concentrator device 110), said concentrator device comprises two communication interfaces 205, one enabling said concentrator device to perform communications via the communication link (such as the communication link 122) that connects said concentrator device to the server 100, and the other enabling said concentrator device to perform powerline communications with one or more electricity meters.

Figure 3:
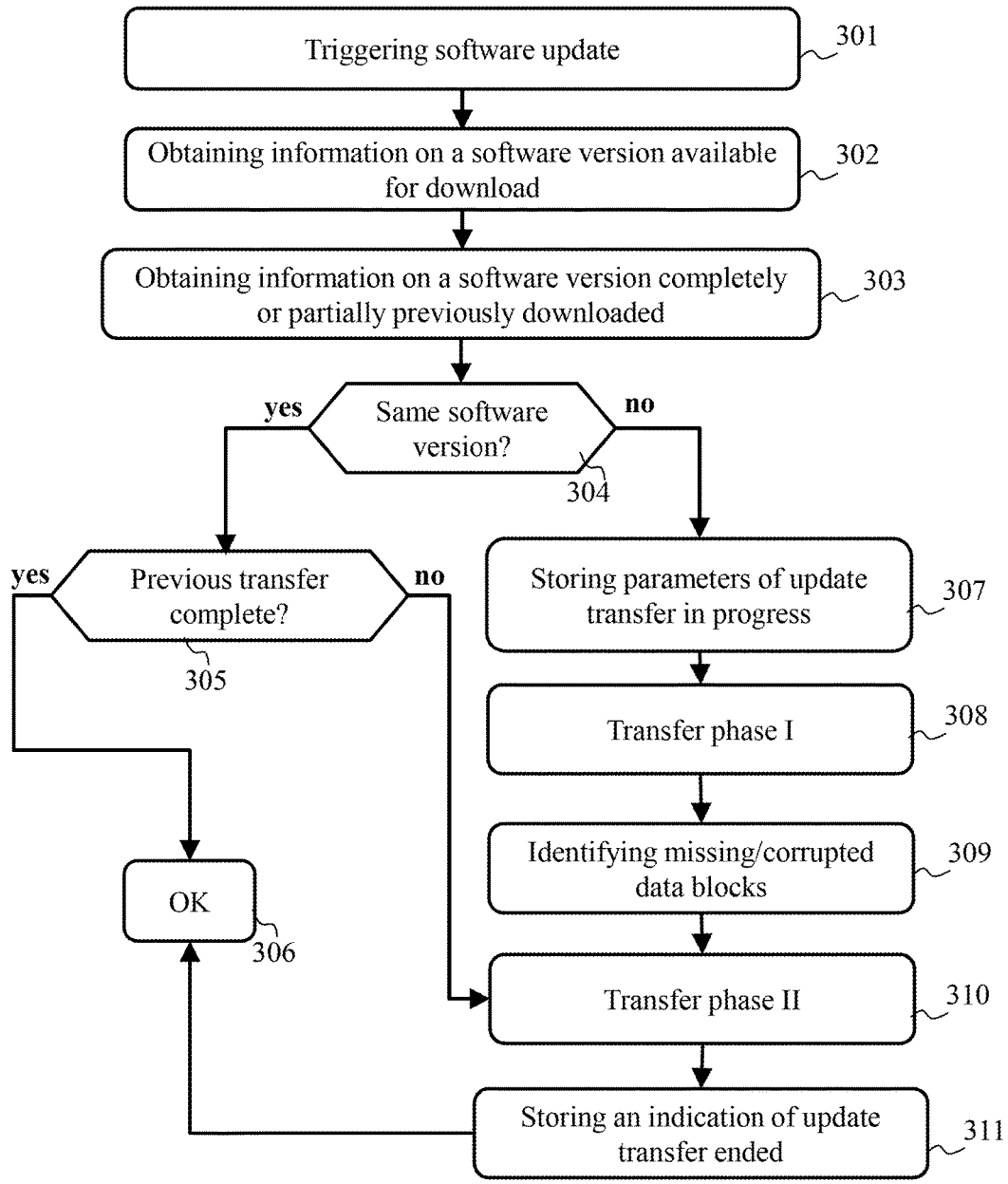
FIG. 3 schematically illustrates an algorithm for updating software in the communication network of FIG. 1.

When the architecture in FIG. 2 represents an electricity meter, said electricity meter further comprises a non-volatile memory 206 in which said electricity meter stores a context, as described hereafter in relation to FIG. 3.

The processor 201 is capable of executing instructions loaded in the RAM 202 from the ROM 203, from an external memory (not shown), from a storage medium (such as an SD card), or from another communication network. When the electricity meter is powered up, the processor 201 is capable of reading instructions from the RAM 202 and executing them. The same principle applies when the architecture in FIG. 2 represents the server 100 or a concentrator device (such as the concentrator device 110). These instructions form a computer program causing the implementation, by the processor 201, of all or part of the behaviour described hereafter in relation to FIG. 3.

All or some of the behaviour described hereafter in relation to FIG. 3 can be implemented in software form by the execution of a set of instructions by a programmable machine, for example a DSP (Digital Signal Processor) or a microcontroller, or be implemented in hardware form by a machine or a dedicated component, for example an FPGA (Field-Programmable Gate Array) or an ASIC (Application-Specific Integrated Circuit).

FIG. 3 schematically illustrates an algorithm for software update in the communication network 120. One or more electricity meters are considered therein.

In a step 301, a check on the need for software update is triggered for at least one electricity meter in the communication network 120. This check may be triggered by the server 100 when the considered electricity meter registers with the communication network 120, for example following a disconnection of the communication subnetwork 121. Such a disconnection may be logical (loss of the communication path with the concentrator device to which said electricity meter was attached) or physical (actual stoppage of said electricity meter). This check may be triggered by the concentrator device 110 when the electricity meter considered re-joins the communication network 121, for example following a disconnection of the communication network 120. This check may be triggered by the server 100 when a new software version is available for deployment on at least some of the electricity meters in the communication network 120. This check may be triggered by the concentrator device 110 when a new software version is available for deployment on at least some of the electricity meters in the communication subnetwork 121. In another variant embodiment, the check on the need for software update is triggered by the considered electricity meter, for example regularly and/or when the electricity meter considered registers with the communication network 120.

In a particular embodiment, the concentrator device 110 may intentionally interrupt the transfer of the new software version, for example to perform or cause to perform tasks of greater importance in the communication subnetwork 121. The check on the need for a software update may then be triggered by the concentrator device 110 when said tasks are complete. In a variant embodiment, the check on the need for software update may then be triggered by the considered electricity meter when said electricity meter has completed the task that was entrusted thereto by the concentrator device 110.

In a following step 302, information on a version of the software that is available for download is obtained. This information is at least a version identifier and a software size. In section 4.4.6.4 of the 12$^{th}$ edition of the "Bluebook: COSEM Interface Classes and OBIS Object Identification System" published by the DLMS User Association, this information is designated by the structure image_to_acti-vate_info, wherein the fields image_to_activate_identification and image_to_activate_size are parameters corresponding respectively to the identifier of the version of the software that is available for download and the size of the version of the software that is available for download. Each new version of the software is supplied by the server 100 to each concentrator device in the communication network 120, with optionally an indication as to which electricity meters in the powerline communication subnetwork to which said concentrator device belongs are relevant for the software update. The step 302 is preferentially performed by the concentrator device 110 by consulting internally which software version (identifier and size) is stored in said concentrator device 110 and made available to the electricity meter in the communication subnetwork 121. In a variant embodiment, the step 302 is performed by the concentrator device 110 by internally consulting which software version (identifier and size) is stored in said server 100 and made available to said electricity meters. In another variant embodiment, the step 302 is performed by each considered electricity meter by requesting from the concentrator device 110 or server 100 which software version (identifier and size) is stored in said server 100 and made available to said electricity meters.

In a following step 303, information of the last software version partially or completely downloaded onto the considered electricity meter is obtained. This information is for example stored in an image_to_activate_info structure, the fields image_to_activate_identification and image_to_activate_size of which are parameters corresponding respectively to the identifier of the last software version partially or completely downloaded onto the considered electricity meter and the size of the last software version partially or completely downloaded onto the considered electricity meter. This information is included in a context stored in a non-volatile memory by each considered electricity meter according to the last software version partially or completely downloaded onto said electricity meter. The step 303 is preferentially performed by the concentrator device 110 by requesting from each considered electricity meter which last software version (identifier and size) was partially or completely downloaded onto said electricity meter. In a variant embodiment, the step 303 is preferentially performed by the server 100 by requesting from each considered electricity meter which last software version (identifier and size) was partially or completely downloaded onto said electricity meter. In another variant embodiment the step 303 is performed by each considered electricity meter by internally consulting which last software version (identifier and size) was partially or completely downloaded onto said electricity meter.

In a following step 304, the information obtained at the step 302 and the information obtained at the step 303 are compared in order to check whether they correspond to the same software version. If such is the case, a step 305 is performed; otherwise a step 307 is performed. If the previous transfer had been interrupted, intentionally or not, the passage from the step 304 to the step 307 means that another more recent software version is available. The step 304 is preferentially performed by the concentrator device 110 from information obtained by said concentrator device 110 at the steps 302 and 303. In another variant embodiment, the step 304 is performed by the server 100 from information obtained by said server 100 at the steps 302 and 303. In another variant embodiment, the step 304 is performed by each considered electricity meter from information obtained by said electricity meter at the steps 302 and 303.

In the step 305, it is checked whether the last software version downloaded onto the considered electricity meter was downloaded completely or whether it was downloaded only partially. Such information forms part of the context stored in non-volatile memory by said electricity meter, via a parameter image_transfer_status representing the progress of the download of the version of the software identified by the parameter image_to_activate_info. If the last version of the software downloaded onto the considered electricity meter was completely downloaded onto the electricity meter in question, a step 306 is performed; if the last version of the software downloaded onto the considered electricity meter was only partially downloaded onto the considered electricity meter, a step 310 is performed. The step 305 is preferentially performed by the concentrator device 110 by requesting each considered electricity meter to indicate whether the last software version was completely downloaded onto said electricity meter or whether it was only partially downloaded. In a variant embodiment, the step 305 is performed by the concentrator device 110 by requesting each considered electricity meter to indicate whether the last software version was completely downloaded onto said electricity meter or whether it was only partially downloaded. In another variant embodiment, the step 305 is performed by each considered electricity meter by internally consulting (in its context stored in non-volatile memory) whether the last software version was completely downloaded onto said electricity meter or whether it was only partially downloaded. The step 305 is performed by the same device as the steps 302, 303 and 304.

In the step 306, the algorithm in FIG. 3 is ended, the most up-to-date available software version being downloaded onto each considered electricity meter.

In the step 307, the software update is triggered and parameters of software update the transfer of which is in progress are stored by each considered electricity meter. In other words, said electricity meter stores in its context in non-volatile memory the fields image_identifier and image_size of the structure image_transfer_initiate respectively in the fields image_to_activate_identification and image_to_activate_size of the structure image_to_activate_info, the structure image_transfer_initiate being supplied to said electricity meter by the concentrator device of the communication subnetwork to which said electricity meter is connected. In addition, said electricity meter stores in its context in non-volatile memory the parameter image_transfer_status indicating that a software version transfer is in progress. The step 307 is preferentially performed by the concentrator device 110 by informing each considered electricity meter of said software update parameters. In a variant embodiment, the step 307 is preferentially performed by the server 100 by informing each considered electricity meter of said software update parameters. In another variant embodiment, the step 307 is performed by each considered electricity meter by informing the concentrator device 110 of its intention to download the software version represented by the information obtained at the step 302.

The software update parameters are stored in non-volatile memory by the considered electricity meters in their respective contexts, which simplifies any subsequent resumption of transfer of the new software version. The fact that this information is stored by the electricity meters simplifies the preservation and recovery of this information; indeed, storing this information on the server 100 implies difficulties in information management, in particular because of electricity meters that may be definitively withdrawn from the communication network 120 and of those that are disconnected from the communication 120 for a long time; and storing this information on the concentrator devices also implies difficulties in management of the electricity meters that are disconnected from one communication subnetwork and then reconnected subsequently to another communication subnetwork.

In a following step 308, a first phase (phase I) of transfer of the new software version available from the server 100 is established. During said first phase of transfer, the new version of the software is transmitted block by block. The new version of the software is thus broken down into successive blocks. The server 100 supplies the new version of the software to each concentrator device in the communication network 120, at least to the one in each communication subnetwork in which there exists at least one electricity meter for which said new version of the software is intended. The server 100 may thus supply to each concentrator device an indication of all the electricity meters concerned in the communication subnetwork to which said concentrator device belongs. Each concentrator device is then responsible for propagating, block by block, the new version of the software to each concerned electricity meter in the communication subnetwork for which said concentrator device is the root. The transfer during the first phase (phase I) occurs therefore block after block in accordance with a sequence independently of whether or not each block has been correctly received by each concerned electricity meter. Preferentially, the blocks are transferred successively in their order of appearance in the set of blocks forming the new version of the software. It will be understood from the above that the transfer during the first phase (phase I) is preferentially performed on the initiative of the concerned concentrator device. Each concentrator device may also know which are the concerned electricity meters in the communication subnetwork to which said concentrator device belongs by obtaining, from the electricity meters in said communication subnetwork, their respective contexts. The blocks can thus be transmitted in broadcast mode, in multicast mode or in unicast mode depending on the quantity of concerned electricity meters.

Interferences or crosstalk phenomena may corrupt the reception of some blocks by one or more electricity meters, or even prevent any reception thereof. The electricity meters shall therefore check, for each block, whether said block has been received without corruption. Each block then preferentially comprises a check code, such as a CRC (Cyclic Redundancy Check) enabling the electricity meter that received a block to determine whether or not said block has been correctly received.

Each block comprises a sequence number, enabling the electricity meter that received a block to determine its position in the new version of the software currently being transferred. Each electricity meter for which the transfer of the new version of the software is intended is thus capable of determining which block has been correctly received by said electricity meter. At the beginning of the download, all the blocks are considered to be not correctly received and a flag in the context stored in non-volatile memory of the electricity meter indicates the status for each block identified by its sequence number. Whenever a block is correctly received, the electricity meter modifies this flag for said block to indicate that said block has been correctly received. Thus, although the download takes place according to a sequencing not taking account of the actual reception of said blocks, each electricity meter knows, for each block of the new version of the software, whether or not said block has been correctly downloaded. This information is subsequently useful for a second phase of the transfer (hereinafter step 310) or for any resumption of the transfer following an interruption, intentional or not, of the transfer.

At the end of the first phase of the transfer, in a following step 309, each electricity meter for which the new version of the software is intended identifies any blocks that have not been correctly received. The second phase of the transfer can then be performed in the step 310. The transfer during the second phase (phase II) therefore occurs block after block, but according to the blocks not correctly received by each electricity meter. The context of each electricity meter, as stored in its non-volatile memory, indicates which blocks have been correctly received by said electricity meter and which blocks have possibly not been correctly received. The context is then used in the second phase to determine which blocks are possibly to be transferred from the concentrator device of the communication subnetwork to which said electricity meter is connected to said electricity meter.

In a preferential embodiment, the transfer during the second phase (phase II) is at the initiative of the concentrator device of the communication subnetwork to which each concerned electricity meter belongs. Each concentrator device requests, from each concerned electricity meter in the communication subnetwork to which said concentrator device belongs, that the context stored by said electricity meter be supplied thereto. Said concentrator device then determines, for each of these electricity meters, which blocks are possibly missing. Said concentrator device then transmits to each of these electricity meters each of the blocks that have not yet been correctly received by said electricity meter. For each block correctly received during the second phase (phase II), said electricity meter modifies the context so that the flag associated with said block reflects the fact that said block has been correctly received.

In a variant embodiment, the transfer during the second phase (phase II) is initiated by each concerned electricity meter. Said electricity meter then requests from the concentrator device to which said electricity meter is attached each of the blocks that have not yet been correctly received. For each block correctly received during the second phase (phase II), the electricity meter modifies the context so that the flag associated with said block reflects the fact that said block has been correctly received.

The transfer of the second phase is repeated until one of the following conditions is fulfilled: all the blocks are correctly received by said concerned electricity meter; and said concerned electricity meter is disconnected.

In a step 311, each electricity meter that has correctly received all the blocks constituting the new version of the software stores in its context in non-volatile memory an indication that the transfer of the new version of the software is complete. In other words, said electricity meter modifies in its context in non-volatile memory the parameter image_transfer_status to indicate that the last software version transfer has ended. Then the step 306 is performed, ending the algorithm in FIG. 3. The version of the software thus transferred can be activated by each electricity meter that has correctly received all the blocks constituting the new version of the software.

Thus, when the step 305 is followed by the step 310, the transfer of the new version of the software resumes according to the second phase (phase II) when the concerned electricity meter or meters reconnect, whatever the communication subnetwork to which said concerned electricity meter or meters reconnect. Each electricity meter stores in non-volatile memory its own context, which allows easily resuming the transfer of the blocks not yet correctly received, independently of the communication subnetwork to which said electricity meter reconnects following a disconnection of the communication network 120.

In an example embodiment, the parameter image_transfer_status may adopt one value among at least the following values, according to the progress with the download of the version of the software onto the concerned electricity meter:
- a value, referred to as image_transfer_not_initiated, indicating that the transfer has not yet been initiated; the parameter image_transfer_status takes this value when the first phase (phase I) has not yet been triggered;
- a value, referred to as image_transfer_initiated, indicating that the transfer has been initiated; the parameter image_transfer_status takes this value when the first phase (phase I) is triggered; and
- a value, referred to as image_verification_successful, indicating that the transfer has been performed and that the version of the software recovered by the concerned electricity meter has been successfully checked; the parameter image_transfer_status takes this value in the step 311.

All the values that the parameter image_transfer_status may take may be enhanced with values representative of intermediate steps of download, of checking or even of activation of the considered software version. For example, this set of values may be enhanced with the following values:
- a value, referred to as image_verification_initiated, indicating that the checking of the downloaded software version has been initiated;
- a value, referred to as image_verification_failed, indicating that the checking of the downloaded software version has been performed and has failed;
- a value, referred to as image_activation_initiated, indicating that the activation of the downloaded software version has been initiated;
- a value, referred to as image_activation_successful, indicating that the downloaded software version has been successfully activated; and
- a value, referred to as image_verification_failed, indicating that the activation of the downloaded software version has failed.

In the event of failure, as potentially indicated by the parameter image_transfer_status as shown above, all the procedure may be reiterated or an indication of failure may be provided to a user via a man-machine interface of the concerned electricity meter. Such an indication of failure may also be provided in the form of a message to the concentrator device of the communication subnetwork to which the concerned electricity meter belongs.

In a particular embodiment, the transferred version of the software contains a signature or a check code enabling the concerned electricity meter to check the integrity of the software version as received. When the electricity meter determines that the software version as received is corrupted, the electricity meter deletes the received blocks and restores its context as it was before the transfer of this version of the software. This means that said electricity meter saves the previous context in non-volatile memory, before the transfer of a new software version begins. When the integrity of the received software version is checked, said version of the software can be activated.

The invention claimed is:

1. A method for transferring a new version of a software to at least one electricity meter in a communication network comprising a server and at least one powerline communication subnetwork, the at least one electricity meter connecting to the communication network via one said powerline communication subnetwork, the at least one powerline communication subnetwork comprising a concentrator device connected to the server, the concentrator device obtaining the new version of the software from the server and being responsible for transferring the new version of the software in the powerline communication subnetwork to which said concentrator device belongs, the method comprising:
the new version of the software being broken down into successive blocks, the transfer of the new version of the software being performed by the concentrator device block by block in two phases:
a first phase during which said concentrator device performs the transfer according to a sequencing independent of whether or not each block has been correctly received, and
a second phase, subsequent to the first phase, during which the concentrator device performs the transfer of each block that was not correctly received by any of the at least one electricity meter during the first phase,
wherein each of the at least one electricity meter stores in non-volatile memory a context including an indication of each block of the new version of the software that has not been correctly received and, when the transfer of the new version of the software to any of the at least one electricity meter is interrupted, subsequent resumption of the transfer of the new version of the software takes place according to the second phase by means of the context, and the context stores:
information identifying the new version of the software that was received and a size of said new version of the software, when all the blocks of said version of the software have been correctly received;
information identifying the new version of the software that is currently being transferred and the size of said new version of the software, when the transfer of the new version is not yet complete; and
when the transfer of the new version of the software is interrupted, resumption of the transfer of the new version of the software takes place according to the second phase if said information stored in said context corresponds to said new version of the software, and otherwise a transfer of another more recent software version is initiated according to the first phase.

2. The method according to claim 1, wherein the transfer of the new version to the at least one electricity meter is interrupted by disconnection of the at least one electricity meter, and the transfer of the new version of the software to the at least one electricity meter resumes according to the second phase when the at least one electricity meter are reconnected, whatever the communication subnetwork to which the at least one electricity meter reconnect.

3. The method according to claim 1, wherein, at the beginning of the transfer of the new version, a flag in the context indicates, associated with each block identified by its sequence number, that said block is considered to be not correctly received, and the at least one electricity meter correctly receiving a block indicates so by modification of the flag associated with said block.

4. The method according to claim 1, wherein, for each block correctly received by an electricity meter of the at least one electricity meter, the context for the electricity meter is modified in order to indicate that said block has been correctly received, and, during said first phase, the transfer of the new version of the software to the electricity meter is at the initiative of the concentrator device to which the electricity meter is attached,
and, during the second phase, the concentrator device requests each of the at least one electricity meter in the communication subnetwork to which said concentrator device belongs to supply thereto with a respective one of the context, and initiates transmission to each of the at least one electricity meter each block that has not been correctly received according to the respective one the context repeatedly until one of the following conditions is fulfilled:
all the blocks are correctly received by each of the at least one electricity meter; and
each of the at least one electricity meter is disconnected.

5. A communication network comprising
at least one electricity meter,
a server, and
at least one powerline communication subnetwork, wherein
each of the at least one electricity meter is connected to the communication network via one said powerline communication subnetwork,
each of the at least one powerline communication subnetwork comprises a concentrator device connected to the server, the concentrator device being configured to obtain, from the server, a new version of a software to be transferred to each of the at least one said electricity meter in the powerline communication subnetwork to which said concentrator device belongs and being responsible for transferring the new version of the software in the powerline communication subnetwork to which said concentrator device belongs,
the new version of the software being broken down into successive blocks, the transfer of the new version of the software being performed by the concentrator device block by block in two phases:
a first phase during which said concentrator device performs the transfer of the new version according to a sequencing independent of whether or not each block has been correctly received, and
a second phase, subsequent to the first phase, during which the concentrator device performs the transfer of each block that was not correctly received by any of the at least one electricity meter during the first phase,
wherein each of the at least one electricity meter comprises a non-volatile memory in which the at least one electricity meter stores a context including an indication of each block of the new version of the software that has not been correctly received and, when the transfer of the new version of the software to any of the at least one electricity meter is interrupted, subsequent resumption of the transfer of the new version of the software to the at least one electricity meter or meters takes place according to the second phase by means of the context, and the context stores:
information identifying the new version of the software that was received and a size of said new version of the software, when all the blocks of said new version of the software have been correctly received, and
information identifying the new version of the software that is currently being transferred and the size of said new version of the software, when the transfer of the new version is not yet complete; and
when the transfer of the new version of the software is interrupted, resumption of the transfer of the new version of the software takes place according to the second phase if said information stored in said context corresponds to said new version of the software, and otherwise a transfer of another more recent software version is initiated according to the first phase.

6. A method for transferring a new version of a software to at least one electricity meter in a communication network comprising a server and at least one powerline communication subnetwork, each of the at least one electricity meter connecting to the communication network via one said powerline communication subnetwork, the method being implemented by a concentrator device connected to the server, the concentrator device obtaining the new version of the software from the server and being responsible for transferring the new version of the software in one said powerline communication subnetwork to which said concentrator device belongs, the method comprising the new version of the software being broken down into successive blocks, the transfer of the new version of the software being performed by the concentrator device block by block in two phases:

a first phase during which the concentrator device performs the transfer of the new version according to a sequencing independent of whether or not each block has been correctly received, and a second phase, subsequent to the first phase, during which the concentrator device performs the transfer of each block that was not correctly received by any of the at least one electricity meter during the first phase, wherein, when the transfer of the new version of the software is interrupted, subsequent resumption of the transfer of the new version of the software takes place according to the second phase by means of one or more contexts that are stored in non-volatile memory of each of the at least one electricity meter and that each include an indication of each block of the new version of the software that has not been correctly received by a respective one of the at least one electricity meter, and the context stores information identifying the new version of the software that was received and a size of said new version of the software, when all the blocks of said new version of the software have been correctly received;

information identifying the new version of the software that is currently being transferred and the size of said new version of the software, when the transfer of the new version is not yet complete; and when the transfer of the new version of the software is interrupted, resumption of the transfer of the new version of the software meter takes place according to the second phase if said information stored in said context corresponds to said new version of the software, and otherwise a transfer of another more recent software version is initiated according to the first phase.

7. Non-transitory information storage medium storing a computer program comprising a set of instructions causing implementation by a processor of the method according to claim 6, when said instructions are executed by said processor.

8. A method for transferring a new version of a software to an electricity meter in a communication network comprising a server and at least one powerline communication subnetwork, the electricity meter connecting to the communication network via one said powerline communication subnetwork, the powerline communication subnetwork comprising a concentrator device connected to the server, the concentrator device obtaining the new version of the software from the server and being responsible for transferring the new version of the software in the powerline communication subnetwork to which said concentrator device belongs, the method being implemented by the electricity meter, the method comprising the new version of the software being broken down into successive blocks, the transfer of the new version of the software being performed by the concentrator device block by block in two phases:

a first phase during which said concentrator device performs the transfer of the new version according to a sequencing independent of whether or not each block has been correctly received, and a second phase, subsequent to the first phase, during which the concentrator device performs the transfer of each block that was not correctly received by the electricity meter during the first phase, wherein the electricity meter stores in non-volatile memory a context including an indication of each block of the new version of the software that has not been correctly received and, when the transfer of the new version of the software to the electricity meter is interrupted, subsequent resumption of the transfer of the new version of the software to the electricity meter takes place according to the second phase by means of said context, and the context stores:

information identifying the new version of the software that was received by the electricity meter and a size of said new version of the software, when all the blocks of said new version of the software have been correctly received by the electricity meter;

information identifying the new version of the software that is currently being transferred and the size of said new version of the software, when the transfer of the new version is not yet complete; and when the transfer of the new version of the software to the electricity meter is interrupted, resumption of the transfer of the new version of the software to the electricity meter takes place according to the second phase if said information stored in said context corresponds to said new version of the software, and otherwise a transfer of another more recent software version is initiated according to the first phase.

9. Non-transitory information storage medium storing a computer program comprising a set of instructions causing implementation by a processor of the method according to claim 8, when said instructions are executed by said processor.

10. A concentrator device comprising a processor configured to execute instructions that cause the concentrator device to:

obtain a new version of a software from a server and transfer the new version of the software in a powerline communication subnetwork to which said concentrator device belongs, the new version of the software being broken down into successive blocks, the transfer of the new version of the software being performed by the concentrator device block by block in two phases:

a first phase during which the concentrator device performs the transfer of the new version according to a sequencing independent of whether or not each block has been correctly received, and a second phase, subsequent to the first phase, during which the concentrator device performs the transfer of each block that was not correctly received by at least one electricity meter during the first phase, wherein, when the transfer of the new version of the software is interrupted, the concentrator device resumes the transfer of the new version of the software according to the second phase by means of one or more contexts that are stored in non-volatile memory of each of the at least one electricity meter and that each include an indication of each block of the new version of the software that has not been correctly received, and the context stores:

information identifying the new version of the software that was received and a size of said new version of the software, when all the blocks of said new version of the software have been correctly received;

information identifying the new version of the software that is currently being transferred and the size of said new version of the software, when the transfer of the new version is not yet complete; and when the transfer of the new version of the software is interrupted, resumption of the transfer of the new version of the software takes place according to the second phase if said information stored in said context corresponds to said new version of the software, and otherwise a transfer of another more recent software version is initiated according to the first phase.

11. An electricity meter comprising a processor configured to execute instructions that cause the electricity meter to:

receive a new version of a software via a communication network comprising a server and at least one powerline communication subnetwork, the new version of the software being broken down into successive blocks, the transfer of the new version of the software being in two phases:

a first phase during which a concentrator device performs the transfer of the new version according to a sequencing independent of whether or not each block has been correctly received, and a second phase, subsequent to the first phase, during which the concentrator device performs the transfer of each block that was not correctly received by the electricity meter during the first phase, wherein the electricity meter is configured to store, in non-volatile memory a context including an indication of each block of the new version of the software that has not been correctly received and, when the transfer of the new version of the software to the electricity meter is interrupted, the electricity meter is configured to resume the transfer of the new version of the software to the electricity meter takes place according to the second phase by means of said context, and the context stores:

information identifying the new version of the software that was received by the electricity meter and a size of said new version of the software, when all the blocks of said new version of the software have been correctly received by said electricity meter;

information identifying the new version of the software that is currently being transferred and the size of said new version of the software, when the transfer of the new version is not yet complete; and when the transfer of the new version of the software to the electricity meter is interrupted, resumption of the transfer of the new version of the software to the electricity meter takes place according to the second phase if said information stored in said context corresponds to said new version of the software, and otherwise a transfer of another more recent software version is initiated according to the first phase.

\* \* \* \* \*